United States Patent
Tonai et al.

(10) Patent No.: US 7,163,892 B2
(45) Date of Patent: Jan. 16, 2007

(54) PROCESS FOR PRODUCING INTEGRATED CIRCUIT, AND SUBSTRATE WITH INTEGRATED CIRCUIT

(75) Inventors: Atsushi Tonai, Kitakyushu (JP);
Toshiharu Hirai, Kitakyushu (JP);
Tsuguo Koyanagi, Kitakyushu (JP);
Masayuki Matsuda, Kitakyushu (JP);
Michio Komatsu, Kitakyushu (JP)

(73) Assignee: Catalysts & Chemicals Industries Co., Ltd. (JP)

( * ) Notice: Subject to any disclaimer, the term of this patent is extended or adjusted under 35 U.S.C. 154(b) by 29 days.

(21) Appl. No.: 10/275,087

(22) PCT Filed: Apr. 23, 2001

(86) PCT No.: PCT/JP01/03451

§ 371 (c)(1),
(2), (4) Date: Nov. 1, 2002

(87) PCT Pub. No.: WO01/84610

PCT Pub. Date: Nov. 8, 2001

(65) Prior Publication Data

US 2003/0157272 A1 Aug. 21, 2003

(51) Int. Cl.
*H01L 21/44* (2006.01)
*H01L 21/336* (2006.01)
*H01L 21/4763* (2006.01)

(52) U.S. Cl. .............. 438/652; 438/270; 438/656; 438/795

(58) Field of Classification Search ......... 438/270, 438/608, 609, 648, 650, 652, 656, 687, 795, 438/798
See application file for complete search history.

(56) References Cited

U.S. PATENT DOCUMENTS

| | | | | |
|---|---|---|---|---|
| 5,219,790 A | * | 6/1993 | Miyatake | 438/653 |
| 5,290,733 A | * | 3/1994 | Hayasaka et al. | 438/678 |
| 5,785,897 A | * | 7/1998 | Toufuku et al. | 252/514 |
| 6,136,228 A | | 10/2000 | Hirai et al. | |
| 6,180,030 B1 | * | 1/2001 | Hirai et al. | 252/512 |

(Continued)

FOREIGN PATENT DOCUMENTS

JP      2-237030 A      9/1990

(Continued)

OTHER PUBLICATIONS

Wada Yuichi et al. (JP 2000-138188), May 2000, Translation.*

(Continued)

*Primary Examiner*—Maria F. Guerrero
(74) *Attorney, Agent, or Firm*—The Webb Law Firm

(57) ABSTRACT

There is provided a process for producing an integrated circuit, wherein not only can conductive fine particles be deposited efficiently and densely in minute wiring channels and connecting holes but also a circuit of low wiring resistance and high density can be formed and wherein a high-degree integration can be achieved to thereby bring about an economic advantage. In particular, there is provided a process for producing an integrated circuit, comprising coating a substrate provided with wiring channels with a coating liquid for integrated circuit formation containing conductive fine particles to thereby form an integrated circuit on the substrate, wherein the coating liquid for integrated circuit formation while being exposed to ultrasonic waves is applied to the wiring channels.

13 Claims, 2 Drawing Sheets

U.S. PATENT DOCUMENTS

| | | | |
|---|---|---|---|
| 6,531,187 B1 * | 3/2003 | Akedo | 427/475 |
| 6,562,217 B1 * | 5/2003 | Tanaka et al. | 205/143 |
| 6,646,331 B1 * | 11/2003 | Sakamoto et al. | 257/678 |
| 6,709,966 B1 * | 3/2004 | Hisatsune et al. | 438/613 |

FOREIGN PATENT DOCUMENTS

| | | |
|---|---|---|
| JP | 5-160018 A | 6/1993 |
| JP | 11-97392 A | 4/1999 |
| JP | 2000-138188 A | 5/2000 |
| JP | 188681 A | 10/2000 |

OTHER PUBLICATIONS

Kogure Naoki (JP 11-097392), Apr. 1999, Translation.*

"Preparation of Noble Metal Ultrafine Particle Alloy Using Ultrasonic Chemical Action and Analysis of Fine Structure Thereof", Abstracts of Paper presented before Symposium of General Autumn Meeting held by Metallurgical Society of Japan, p. 70 (1997), English translation of p. 70 attached.

ULVAC Technical Journal, No. 51, 1999, pp. 15-19, English translation of relevant parts attached.

* cited by examiner (1)

(2)

PROCESS FOR PRODUCING INTEGRATED CIRCUIT, AND SUBSTRATE WITH INTEGRATED CIRCUIT

BACKGROUND OF THE INVENTION

1. Field of the Invention

The present invention relates to a process for producing an integrated circuit, including coating a substrate provided with wiring channels with a coating liquid for integrated circuit formation containing a component for conductive fine particle formation and/or conductive fine particles to thereby form an electrical circuit on the substrate, wherein the coating liquid for integrated circuit formation while being exposed to ultrasonic waves is applied to the wiring channels. The present invention also relates to a substrate with integrated circuit produced by this process.

2. Description of the Prior Art

Various integrated circuits are used in computers and other various electronic equipments. An increase of circuit density and an enhancement of circuit performance are demanded in accordance with the trend toward miniaturization and sophistication of such equipments.

In particular, for example, semiconductor integrated circuits will be specified. It is common practice to use, for example, a multilayer wiring circuit as shown in FIG. 5 for the purpose of increasing the integration of semiconductor integrated circuit. FIG. 5 is a schematic sectional view of semiconductor integrated circuit. The process for producing such an integrated circuit will be described below. A thermal oxidation film as the first insulating film 32 is formed on substrate 31 of silicon or the like. The first wiring layer 33 consisting of an aluminum film or the like is formed on the surface of the first insulating film 32. Interlayer insulating film 34 consisting of a silica film, a silicon nitride film or the like is provided by coating thereon according to, for example, the CVD method or plasma CVD method. Silica insulating film (planarizing film) 35 for planarizing the interlayer insulating film 34 is formed on the interlayer insulating film 34. The silica insulating film 35 is coated with the second insulating film 36 if necessary. Thereafter, the second wiring layer (not shown) is formed thereon, and the surface of the second wiring layer is coated with an interlayer insulating film, a planarizing film and an insulating film according to necessity.

However, in the wiring by means of an aluminum film, the aluminum constituting the wiring layer is oxidized at the sputtering performed in the forming of multilayer wiring to thereby increase the resistance value of wiring layer, occasionally resulting in conductive failure. Further, because of the difficulty in reducing the wiring width, there has been a limit in the forming of integrated circuits of higher density. Still further, in recent years, there is a new problem such that, with respect to long-distance wiring such as a clock line or a data bus line, the wiring resistance is increased in accordance with an increase of chip size, thereby causing an increase of propagation delay time of electrical signal (RC delay time=resistance×capacity) Therefore, it is now needed to use a material of lower resistance in wiring layers.

Accordingly, it has been proposed to perform Cu wiring in place of the conventional wiring with Al or Al alloys. For example, it has been proposed to first provide an insulating film superimposed on a substrate with wiring channels and subsequently deposit Cu in the wiring channels according to the electroplating method, CVD method, etc. so as to form an intended wiring. However, in this technique, it has been difficult to accomplish satisfactory deposition of Cu in minute wiring channels and connecting holes with the intent to densify wiring. Furthermore, it has been difficult to obtain deposit films with satisfactory planarity. Still further, it has been experienced that the deposit films are not dense films and have holes formed therein.

For coping with these problems, it has been proposed to employ a method (SOM method) wherein a solution containing ultrafine particles of Cu is applied onto a substrate provided with wiring channels according to the spin coating method to thereby form a circuit on the substrate (ULVAC TECHNICAL JOURNAL, No. 51, 1999, p. 15). However, in this technique, the thickness of deposit film which can be formed by one application is so small that the application must be repeated for realizing wiring with all the wiring channels filled up. Further, the spin coating method has a drawback in that, when it is intended to uniformly apply the solution containing ultrafine particles of Cu onto the entire surface of substrate, portion of the solution containing ultrafine particles of Cu would be applied outside the substrate, thereby causing the ratio of utilization of the solution containing ultrafine particles of Cu to be low.

Moreover, the deposition of metal fine particles, such as Cu fine particles, is effected by the weight of metal fine particles themselves, so that the closest packing with metal fine particles may not be realized. Thus, it has been experienced that the interparticulate resistance cannot be reduced to thereby disenable obtaining a circuit of satisfactorily low wiring resistance.

SUMMARY OF THE INVENTION

The present invention has been made with a view toward solving the above problems of the prior art. Therefore, it is an object of the present invention to provide a process for producing an integrated circuit, wherein not only can conductive fine particles be deposited efficiently and densely in minute wiring channels and connecting holes but also a circuit of low wiring resistance and high density can be formed and wherein a high-degree integration can be achieved to thereby bring about an economic advantage. It is another object of the present invention to provide a substrate with integrated circuit which can be produced by the above process.

In one aspect of the present invention, there is provided a process for producing an integrated circuit, comprising coating a substrate provided with wiring channels of given width and given depth with a coating liquid for integrated circuit formation containing a component for conductive fine particle formation and/or conductive fine particles to thereby form an integrated circuit on the substrate, wherein the coating liquid for integrated circuit formation while being exposed to ultrasonic waves is applied to the wiring channels.

In the present invention, the coating liquid for integrated circuit formation while being exposed to ultrasonic waves is applied to the wiring channels. Consequently, on the one hand (1), when use is made of the coating liquid for integrated circuit formation containing a component for conductive fine particle formation, the exposure to ultrasonic waves leads to formation of conductive fine particles and causes the temperature of coating liquid to rise, thereby evaporating the dispersion medium of coating liquid, so that coating while the coating liquid is being concentrated can be performed. Furthermore, the vibrational energy of ultrasonic waves is transmitted to conductive fine particles, so that the conductive fine particles would collide against the wall of wiring channels to thereby cause impacts, which impacts would realize dense alignment of particles. Therefore, even when the width of wiring channels is limited, conductive fine particles can be selectively formed into a laminate in the wiring channels. On the other hand (2), when use is made of the coating liquid for integrated circuit formation containing conductive fine particles, the exposure to ultrasonic waves causes the temperature of coating liquid to rise, thereby evaporating the dispersion medium of coating liquid, so that coating while the coating liquid is being concentrated can be performed. Furthermore, the vibrational energy of ultrasonic waves is transmitted to conductive fine particles, so that the conductive fine particles would collide against the wall of wiring channels, thereby particles would be aligned densely by impact at colliding. Therefore, even when the width of wiring channels is limited, conductive fine particles can be selectively formed into a laminate in the wiring channels. Moreover, in the use of the coating liquid for integrated circuit formation containing a component for conductive fine particle formation and/or conductive fine particles, not only would the above phenomena (1) and (2) simultaneously occur but also a circuit wherein particles formed into a laminate in the circuit are in surface contact with each other would be formed. As a result, even when the number of coating liquid applications is small, a circuit of high integration exhibiting excellent adherence to the wiring channels can be obtained.

It is preferred to planarize a coating surface resulting from the coating with the coating liquid for integrated circuit formation.

Preferably, the conductive fine particles are metal fine particles comprising at least one metal selected from the group consisting of Au, Ag, Pd, Pt, Rh, Ru, Cu, Fe, Ni, Co, Sn, Ti, In, Al, Ta, Sb and W.

The conductive fine particles preferably have an average particle diameter which is 70% or less of the width of wiring channels and which is in the range of 1 to 200 nm.

It is preferred that the depth (D) of wiring channels be in the range of 0.05 to 10 μm, that the width (Wc) of wiring channels be in the range of 0.05 to 100 μm, and that the ratio (D/Wc) between the depth (D) of wiring channels and the width (Wc) of wiring channels be in the range of 0.1 to 20.

In another aspect of the present invention, there is provided a substrate with integrated circuit, comprising a substrate and, superimposed thereon, an integrated circuit, the integrated circuit produced by the above process.

DETAILED DESCRIPTION OF THE PREFERRED EMBODIMENTS

Figure 1:
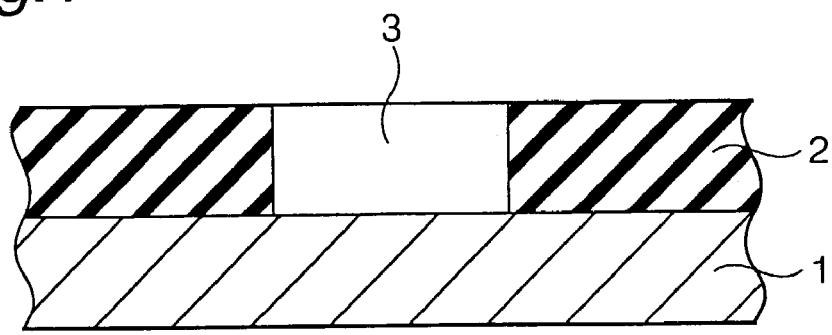
FIG. 1 is a schematic sectional view of a substrate provided with wiring channels for use in the present invention.

In the drawing, numeral 1 denotes a substrate, numeral 2 an insulating film, numeral 3 a wiring channel, numeral 11 a substrate, numeral 12 an insulating film, numeral 13 a layer of conductive fine particles, numeral 14 a barrier metal layer, numeral 21 a substrate, numeral 22 the first insulating film, numeral 23 a wiring layer, numeral 24 the second insulating film, numeral 31 a substrate, numeral 32 the first insulating film, numeral 33 the first wiring layer, numeral 34 an interlayer insulating film, numeral 35 a silica insulating film (planarizing film), and numeral 36 the second insulating film.

The present invention will be described in detail below.

The process for producing an integrated circuit according to the present invention is one comprising coating a substrate provided with wiring channels of given width and given depth with a coating liquid for integrated circuit formation containing a component for conductive fine particle formation and/or conductive fine particles to thereby form an integrated circuit on the substrate, wherein the coating liquid for integrated circuit formation while being exposed to ultrasonic waves is applied to the wiring channels.

In the integrated circuit according to the present invention, use is made of, for example, a substrate provided with wiring channels as shown in FIG. 1. FIG. 1 is a schematic sectional view of a substrate provided with wiring channels for use in the process for producing an integrated circuit according to the present invention. In the drawing, numeral 1 denotes a substrate, numeral 2 an insulating film, and numeral 3 a wiring channel.

[Substrate 1]

The substrate 1 for use in the present invention can be constituted of silicon, glass or the like.

[Insulating Film 2]

The insulating film 2 is formed on the above substrate.

The insulating film is not particularly limited as long as it is constituted of an insulating material. For example, it is constituted of silica, alumina, titania, silicon nitride, silicon carbide, an organic resin polymer, plasma TEOS (plasma TEOS refers to a product of plasma vapor deposition of tetraethyl orthosilicate (TEOS)) or the like.

The insulating film 2 may be constituted of a single material or a mixture of a plurality of materials. Further, the insulating film 2 may have a multilayer structure consisting of varied insulating films arranged vertically.

The insulating film 2 can be formed by known methods. For example, it can be formed by the spin coating method, CVD method, sputtering method, plasma CVD method, or the like.

For example, the use of an insulating film of silica (SOG film) disclosed in Japanese Patent Laid-open Publication No. 2(1990)-237030 relating to another application of the applicant is preferred from the viewpoint of high contact resistance, low dielectric constant and excellent planarity.

The thickness of the above insulating film is preferably in the range of 0.1 to 6 μm.

When the thickness of the insulating film 2 is less than 0.1 μm, the thickness may be too small to ensure the insulation. On the other hand, when the thickness of the insulating film 2 exceeds 6 μm, the insulating film 2 may suffer cracking.

In the substrate with wiring channels for use in the present invention, it is not necessarily needed to provide a monolayer insulating film as shown in FIG. 1, and a laminate of a plurality of insulating films as mentioned above may be provided. With respect to the laminate of a plurality of insulating films, it is preferred that the final thickness of insulating film laminate be in the range of 0.1 to 6 μm.

[Wiring Channel 3]

In the substrate with wiring channels for use in the present invention, the insulating film is provided with wiring channels.

The depth (Dc) of wiring channels is preferably in the range of 0.05 to 10 μm, still preferably 0.1 to 5 μm.

The width (Wc) of wiring channels is preferably in the range of 0.05 to 100 μm, still preferably 0.1 to 20 μm.

When the width (Wc) of wiring channels is less than 0.05 μm, the width may be too small to selectively feed conductive fine particles into the wiring channels.

On the other hand, when the width (Wc) of wiring channels exceeds 100 μm, the width of wiring channels may be too large to form a circuit of high density.

When the width of wiring channels falls within the above range, conductive fine particles formed as a result of exposure of the component for conductive fine particle formation to ultrasonic waves, or conductive fine particles contained in advance absorb energy of exposure ultrasonic waves. Thus, dense deposition of conductive fine particles can be accomplished while the conductive fine particles collide against the bottom and side wall of wiring channels or collide against sequentially deposited conductive fine particles. Consequently, junction surfaces of conductive fine particles can be increased to thereby enable forming a circuit of low circuitry resistance. Also, a circuit exhibiting high adherence to the bottom or sidewall of wiring channels (occasionally, barrier metal formed in wiring channels as mentioned later) can be formed.

When the depth (Dc) of wiring channels is less than 0.05 μm, the width of circuit must be increased for ensuring the conductivity of circuit, so that forming of a circuit of high density may be disenabled.

On the other hand, when the depth (Dc) of wiring channels exceeds 10 μm, the thickness of wiring layers may be too large to obtain an integrated circuit exhibiting high integration in the direction of height.

The ratio (Dc/Wc) between the depth (Dc) of wiring channels and the width (Wc) of wiring channels is preferably in the range of 0.1 to 20. Even if the depth (Dc) of wiring channels and the width (Wc) of wiring channels fall within the above ranges, when the ratio Dc/Wc, referred to as "aspect ratio", is less than 0.1, the conductivity of circuit may not be ensured. Increasing the width of circuit for coping with this problem may disenable forming a circuit of high density. On the other hand, when the aspect ratio Dc/Wc exceeds 20, the conductivity of circuit may not be ensured. Increasing the height of circuit for coping with this problem may disenable forming a circuit exhibiting high integration in vertical direction.

These wiring channels can be formed by providing a 0.1 to 10 μm line-and-space photoresist film (PR film) on a substrate and subsequently performing sputtering thereon.

[Formation of Barrier Metal Layer]

In the process for producing an integrated circuit according to the present invention, a barrier metal layer may be formed on the inner surface of wiring channels before the application of the coating liquid for integrated circuit formation. In the forming of such a barrier metal layer, known methods can be employed. For example, the barrier metal layer can be formed by sputtering of TiN, Ta, TaN or the like. The thickness of the barrier metal layer is generally in the range of 50 to 200 nm.

The formation of the barrier metal layer enables not only preventing the diffusion of conductive fine particle components for circuit formation, organic stabilizers described later and impurities such as ions into the insulating film or the corrosion of the insulating film therewith but also inhibiting the drop of insulating capability of insulating film attributed to the above diffusion into and corrosion of the insulating film.

[Formation of Circuit]

In the present invention, the formation of circuit is carried out by coating the substrate provided with wiring channels with the coating liquid for integrated circuit formation while being exposed to ultrasonic waves, optionally followed by drying and thermal treatment.

Coating Liquid for Integrated Circuit Formation

The coating liquid for integrated circuit formation for use in the present invention comprises a component for conductive fine particle formation and/or conductive fine particles and a solvent. In the coating liquid for integrated circuit formation, the component for conductive fine particle formation may be contained alone, or conductive fine particles may be contained alone. Alternatively, the component for conductive fine particle formation may be contained together with conductive fine particles. The solvent may be water, or an organic solvent, or a mixture of water and an organic solvent.

[Component for Conductive Fine Particle Formation]

The component for conductive fine particle formation refers to a component capable of forming conductive fine particles, such as the following metal fine particles of single component or composite metal fine particles containing a plurality of metal components, and there can be mentioned metal ions. Examples thereof include ions of metals such as Au, Ag, Pd, Pt, Rh, Ru, Cu, Fe, Ni, Co, Sn, Ti, In, Al, Ta, Sb and W. Of these, ions of metals including Au, Ag, Pd, Pt, Rh and Cu are preferred.

As examples of compounds containing these metal ions, there can be mentioned $NaAuCl_4$, $AgClO_4$, $AgNO_3$, $PdCl_2 \cdot 2NaCl$, $Pd(NO_3)_2$, $K_2PtCl_4$, $H_2PtCl_6$ and $CuCl_2$.

This component for conductive fine particle formation, when exposed to ultrasonic waves, easily forms metal colloid fine particles of diameter approximately equal to that of the following conductive fine particles.

[Conductive Fine Particle]

Any conductive fine particles can be used without particular limitation as long as conductivity is exhibited. For example, use can be made of metal fine particles, metal oxide fine particles, conductive carbon and conductive polymer fine particles.

In the present invention, metal fine particles are preferably used as the conductive fine particles.

Known metal fine particles can be used as the metal fine particles, which may be metal fine particles of single component or composite metal fine particles containing a plurality of metal components. The plurality of metals constituting the composite metal fine particles may form an alloy being in the state of a solid solution, a eutectic not being in the state of a solid solution or a mixture of such an alloy and such a eutectic. In these composite metal fine particles, the metal oxidation and ionization are inhibited, so that, for example, the particulate growth of composite metal fine particles is inhibited. Thus, the reliability of the composite metal fine particles is high in that, for example, their corrosion resistance is high and the deterioration of their conductivity (rise of resistance value) is slight.

Metal fine particles comprising at least one metal selected from the group consisting of Au, Ag, Pd, Pt, Rh, Ru, Cu, Fe, Ni, Co, Sn, Ti, In, Al, Ta, Sb and W are preferably used as the above metal fine particles.

In particular, as the metal fine particles, there can be mentioned fine particles of a metal selected from the group consisting of Au, Ag, Pd, Pt, Rh, Ru, Cu, Fe, Ni, Co, Sn, Ti, In, Al, Ta, Sb and W.

Further, as the above composite metal fine particles, there can be mentioned those composed of at least two of metals selected from the group consisting of Au, Ag, Pd, Pt, Rh, Ru, Cu, Fe, Ni, Co, Sn, Ti, In, Al, Ta, Sb and W. Preferred combinations of two or more types of metals include, for example, Au—Cu, Ag—Pt, Ag—Pd, Au—Pd, Au—Rh, Pt—Pd, Pt—Rh, Fe—Ni, Ni—Pd, Fe—Co, Cu—Co, Ru—Ag, Au—Cu—Ag, Ag—Cu—Pt, Ag—Cu—Pd, Ag—Au—Pd, Au—Rh—Pd, Ag—Pt—Pd, Ag—Pt—Rh, Fe—Ni—Pd, Fe—Co—Pd and Cu—Co—Pd.

In the use of metal fine particles of a metal such as Au, Ag, Pd, Pt, Rh, Cu, Co, Sn, In or Ta, part thereof may be in oxidized form. Also, the metal fine particles may contain an oxide of the metal. Further, compounds having bonded P or B atoms may be contained in the metal fine particles.

These metal fine particles can be obtained by known processes (see Japanese Patent Laid-open Publication No. 10(1998)-188681). For example, the metal fine particles can be prepared by a process wherein, in a mixed solvent of an alcohol and water, a single metal salt is reduced, or a plurality of metal salts are simultaneously or separately reduced. In this process, a reducing agent may be added according to necessity. Examples of suitable reducing agents include ferrous sulfate, trisodium citrate, tartaric acid, sodium borohydride and sodium hypophosphite. Further, heat treatment may be performed in a pressure vessel at about 100° C. or higher.

Also, the metal fine particles can be prepared by another process, which comprises providing a dispersion of fine particles of a single-component metal or fine particles of an alloy and causing fine particles or ions of a metal having a normal hydrogen electrode potential higher than that of the above single-component metal fine particles or alloy fine particles to be present in the dispersion to thereby precipitate the metal of higher normal hydrogen electrode potential on the single-component metal fine particles and/or alloy fine particles. In this process, a metal of still higher normal hydrogen electrode potential may be further precipitated on the thus obtained composite metal fine particles.

It is preferred that the metal exhibiting the highest normal hydrogen electrode potential be abundant in the surface layer of the composite metal fine particles. The presence in abundance of the metal exhibiting the highest normal hydrogen electrode potential in the surface layer of the composite metal fine particles would inhibit the oxidation and ionization of the composite metal fine particles to thereby enable suppressing the particulate growth attributed to, for example, ion migration. Further, these composite metal fine particles have high corrosion resistance, so that the deterioration of conductivity can be suppressed.

Moreover, the metal fine particles can be prepared by the ultrasonic wave exposure direct reduction method described on, for example, page 70 of Abstracts of Papers (1997) presented before Symposium of General Autumn Meeting held by the Metallurgical Society of Japan. For example, the metal fine particles can be prepared by exposing a solution containing noble metal ions (for example, $Ag^+$, $Au^{3+}$, $Pd^{2+}$, $Pt^{2+}$ or $Pt^{4+}$) and having an organic compound such as a surfactant added thereto according to necessity to ultrasonic waves in an inert gas atmosphere at, for example, 200 kHz and 6 $W/cm^2$.

The average diameter of these metal fine particles preferably ranges from 1 to 200 nm, still preferably from 2 to 70 nm.

When the average diameter of the metal fine particles exceeds 200 nm, the metal fine particles are too large to enter the wiring channels. Even if the metal fine particles manage to enter the wiring channels, dense deposition thereof cannot be effected to thereby render forming of a circuit of low resistance value difficult.

On the other hand, when the average diameter of the metal fine particles is less than 1 nm, the surface resistance between deposited particles may be increased so sharply that a circuit exhibiting a resistance value as low as capable of attaining the object of the present invention cannot be formed.

Further, in the present invention, conductive metal oxide fine particles may be used in place of the above metal fine particles, or in combination with the above metal fine particles. As the conductive metal oxide, there can be mentioned, for example, tin oxide, tin oxide doped with Sb, For P, indium oxide, indium oxide doped with Sn or F, antimony oxide or low-order titanium oxide.

It is preferred that the average diameter of these conductive metal oxide fine particles be 70% or less of the width of wiring channels and range from 1 to 200 nm, especially from 2 to 70 nm.

The coating liquid for integrated circuit formation for use in the present invention may contain conductive fine particles other than the above metal fine particles and the above metal oxide fine particles.

Furthermore, use can be made of inorganic conductive fine particles such as conductive carbon, and conductive fine particles constituted of a conductive polymer such as polyacetylene, polypyrrole or poly-p-phenylene.

It is preferred that the average diameter of these conductive fine particles range from 1 to 200 nm, especially from 2 to 70 nm.

[Organic Solvent]

As the organic solvent for use in the coating liquid for integrated circuit formation, there can be mentioned, for example, alcohols such as methanol, ethanol, propanol, butanol, diacetone alcohol, furfuryl alcohol, tetrahydrofurfuryl alcohol, ethylene glycol and hexylene glycol; esters such as methyl acetate and ethyl acetate; ethers such as diethyl ether, ethylene glycol monomethyl ether, ethylene glycol monoethyl ether, ethylene glycol monobutyl ether, diethylene glycol monomethyl ether and diethylene glycol monoethyl ether; and ketones such as acetone, methyl ethyl ketone, acetylacetone and acetoacetic esters. These may be used individually or in combination.

Although the concentration of component for conductive fine particle formation and/or conductive fine particles in the coating liquid for integrated circuit formation is not particularly limited as long as the fluidity of coating liquid can be ensured, it is preferred that the component for conductive fine particle formation and/or conductive fine particles be contained in an amount, in terms of solid contents or metal (in terms of formed metal or composite metal fine particles with respect to the component for conductive fine particle formation and in terms of the total thereof when the component for conductive fine particle formation and conductive fine particles are contained; the same applies hereinafter), of 0.05 to 30% by weight, especially 0.1 to 10% by weight, and still especially 0.2 to 5% by weight.

When the amount, in terms of solid contents or metal, of component for conductive fine particle formation and/or conductive fine particles contained in the coating liquid for integrated circuit formation is less than 0.05% by weight, the concentration is so low that repeated applications are inevitably needed. Further, the evaporation of solvent takes time, so that a prolonged period of time is required for circuit formation.

On the other hand, when the amount, in terms of solid contents or metal, of component for conductive fine particle formation and/or conductive fine particles exceeds 30% by weight, formed particles may be in aggregated form, or conductive fine particles may aggregate together in the coating liquid. Consequently, it may be experienced that dense deposition of conductive fine particles cannot be effected to thereby disenable obtaining a circuit of low resistance value. Even if such a circuit is obtained, the conductivity thereof may be lowered during the use for a prolonged period of time.

[Component for Matrix Formation]

The coating liquid for integrated circuit formation for use in the present invention may contain a component for matrix formation which acts as a binder of conductive fine particles after the formation of an integrated circuit or acts as a binder between the same and wiring channel walls (including barrier metal walls).

This component for matrix formation, although conventional ones can be employed, is preferably constituted of a precursor of at least one oxide selected from among silica, silica-based composite oxides, zirconia and antimony oxide in the present invention. In particular, a product obtained by hydrolysis and polycondensation of an organosilicon compound such as an alkoxysilane, or silicic acid obtained by dealkalizing an aqueous solution of alkali metal silicate is preferably used. Also, for example, resins for use in paints can be employed as the component for matrix formation.

This component for matrix formation is appropriately contained in an amount, in terms of oxide (in the use of an inorganic compound) or resin, of 0.01 to 0.5 part by weight, preferably 0.03 to 0.2 part by weight, per part by weight of metal with respect to the amount, in terms of solid contents or metal, of component for conductive fine particle formation and/or conductive fine particles.

[Organic Stabilizer]

In the present invention, when a component capable of forming metal fine particles is used as the component for conductive fine particle formation, or when metal fine particles are used as the conductive fine particles, an organic stabilizer or a surfactant may be contained in the coating liquid for integrated circuit formation in order to accelerate the formation of metal fine particles, or to improve the dispersion performance of metal fine particles, or to enhance the stability of dispersion. As the above organic stabilizer or surfactant, there can be mentioned, for example, gelatin, polyvinyl alcohol and polyvinylpyrrolidone; oxalic acid, malonic acid, succinic acid, glutaric acid, adipic acid, sebacic acid, maleic acid, fumaric acid, phthalic acid, citric acid and other polybasic carboxylic acids and salts thereof; and further sulfonic acid salts, organosulfonic acid salts, phosphoric acid salts, organophosphoric acid salts, heterocyclic compounds, polycarboxylic acids and mixtures of these compounds.

Although the amount of organic stabilizer or surfactant is varied depending on the type thereof, the diameter of metal fine particles, etc., the organic stabilizer or surfactant can appropriately be contained in the coating liquid in an amount of 0.005 to 5 parts by weight, preferably 0.01 to 2 parts by weight, per part by weight of metal with respect to the amount, in terms of solid contents or metal, of component for conductive fine particle formation and/or conductive fine particles (metal fine particles). When the amount of organic stabilizer or surfactant is less than 0.005 part by weight, desirable dispersion and stability performance cannot be realized. On the other hand, when the amount of organic stabilizer or surfactant is larger than 5 parts by weight, a conductivity deterioration may be caused.

With respect to the coating liquid for integrated circuit formation for use in the present invention, when the conductive fine particles, in particular, metal fine particles are used in the state of being dispersed in water and/or an organic solvent, it is preferred that the total concentration of ions including alkali metal ions, ammonium ion, polyvalent metal ions, inorganic anions such as mineral acid anions, and organic anions such as acetic acid and formic acid anions, which are liberated from the particles and present in the coating liquid be 10 mmol or less per 100 g of solid contents contained in the dispersion. In particular, inorganic anions such as mineral acid anions are detrimental to the stability and dispersibility of metal fine particles, so that the smaller the amount thereof in the dispersion, the greater the preference. When the ion concentration is low, the dispersion condition of metal fine particles contained in the coating liquid for integrated circuit formation is excellent. Thus, a coating liquid in which substantially no aggregated particles are contained can be obtained. The monodisperse condition of metal fine particles in the coating liquid can be maintained during the course of circuit formation. Accordingly, when an integrated circuit is formed from the coating liquid for integrated circuit formation having a low ion concentration, a dense circuit of low resistance value can be obtained because of the absence of aggregated particles.

In the circuit formed from the above dispersion of low ion concentration, conductive fine particles such as metal fine particles can be appropriately dispersed and aligned. Consequently, there can be provided an integrated circuit of high reliability with no defect as compared with circuits wherein conductive fine particles are aggregated.

The method of deionizing for obtaining the above coating liquid of low ion concentration is not particularly limited if finally the ion concentration of the coating liquid falls within the above range. As preferred deionization methods, however, there can be mentioned one in which either the dispersion of conductive fine particles as a feedstock for the coating liquid or the coating liquid for integrated circuit formation prepared from the dispersion is brought into contact with a cation exchange resin and/or an anion exchange resin, and another method in which these liquids are purified with an ultrafilter membrane.

[Method of Coating Liquid Application]

In the present invention, although the method of applying the coating liquid for integrated circuit formation is not particularly limited as long as the wiring channels can be coated with the coating liquid for integrated circuit formation while being exposed to ultrasonic waves, it is preferred that the application be effected in such a manner that the coating liquid flowing out of, for example, a nozzle fitted to a vessel can uniformly be exposed to ultrasonic waves and that selective application to the wiring channels can be accomplished.

In the present invention, the coating liquid for integrated circuit formation during application is exposed to ultrasonic waves. In particular, the coating liquid while dropping from or flowing out of the above nozzle or the like and/or the coating liquid having been deposited in the wiring channels is exposed to ultrasonic waves.

Although the ultrasonic wave exposure conditions are varied depending on the concentration, in terms of metal, of component for metal fine particle formation in the coating liquid for integrated circuit formation, the concentration and average diameter of conductive fine particles in the coating liquid for integrated circuit formation, the boiling point of solvent, the application speed of coating liquid, etc. and are not particularly limited as long as conductive fine particles can selectively be applied into the wiring channels, appropriate selection can be made within the range of 20 to 400 kHz and within the range of 5 to 400 W.

When the coating liquid for integrated circuit formation contains the component for conductive fine particle formation, the exposure to ultrasonic waves brings about not only heating of the coating liquid but also formation of conductive fine particles. Under the evaporation of solvent, the coating liquid is concentrated, dried and enters the wiring channels with the result that conductive fine articles are deposited in the wiring channels to thereby form a layer of conductive fine particles in the wiring channels. Thus, a circuit is formed.

On the other hand, when the coating liquid for integrated circuit formation contains conductive fine particles, the exposure to ultrasonic waves brings about heating of the coating liquid. Under the evaporation of solvent, the coating liquid is concentrated, dried and enters the wiring channels with the result that conductive fine particles are deposited in the wiring channels to thereby form a layer of conductive fine particles in the wiring channels. Thus, a circuit is formed.

The thus formed conductive fine particles including metal fine particles absorb the energy of ultrasonic waves. Consequently, the conductive fine particles having entered the wiring channels would collide against the bottom and side wall of wiring channels and collide with each other, so that conductive fine particles would be densely deposited sequentially from the bottom of wiring channels to thereby form a circuit.

After the formation of a circuit by satisfactorily filling the wiring channels, a further exposure to ultrasonic waves (second ultrasonic wave exposure) may be effected according to necessity.

Alternatively, the coating liquid for integrated circuit formation can be applied by the spinner method before carrying out the second ultrasonic wave exposure. This second ultrasonic wave exposure enables planarizing the upper surface of substrate after the circuit formation, thereby facilitating the planarizing operation (for example, chemical machine polishing (CMP)) performed after the circuit formation according to necessity.

The method of forming an integrated circuit according to the present invention enables selective dense deposition of conductive fine particles in the wiring channels and filling the wiring channels with conductive fine particles to thereby form a circuit in such a fashion that the upper end surface of wiring channels is substantially in agreement with the upper end surface of conductive fine particle layer. Therefore, the formation of conductive layer (sacrificial layer) high over the upper end surface of wiring channels as observed in the conventional plating method, CVD method and PVD method and in the above-mentioned SOM method can be restricted, so that the planarizing operation can be strikingly facilitated and that the end surface after the planarizing operation is excellent in planarity. Accordingly, an economic advantage can be ensured in the formation of integrated circuit.

The application of the coating liquid for integrated circuit formation under exposure to ultrasonic waves is optionally followed by heating (curing) at about 200 to 400° C. in an oxidative and/or reducing atmosphere or in an inert gas atmosphere. This heating not only removes impurities if any in the circuit but also promotes the junction of conductive fine particles, so that a circuit of low resistance value exhibiting excellent adherence to the wiring channels can be obtained. When the wiring channels are fitted with the barrier metal layer, a circuit of especially high adherence can be obtained.

Thereafter, the formed conductive fine particle layer is preferably subjected to planarizing operation.

Figure 2:
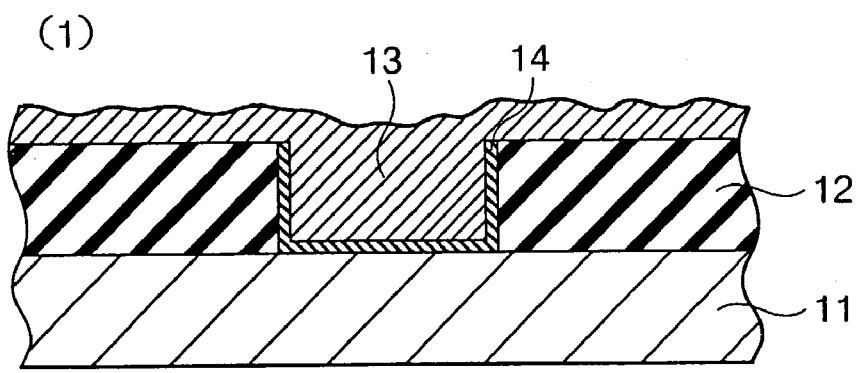
FIG. 2 is a schematic view showing an outline of planarizing operation.
Figure 2:
Figure 2:
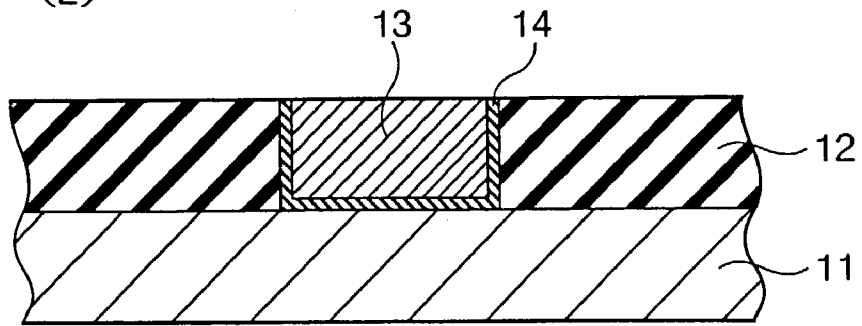

The planarizing operation is carried out in a manner as shown in FIG. 2. FIG. 2 is a schematic view showing an outline of planarizing operation. Numeral 11 denotes a substrate, numeral 12 an insulating film, numeral 13 a formed conductive fine particle layer, and numeral 14 a barrier metal layer.

Referring to FIG. 2(1), the conductive fine particle layer immediately after the formation thereof is disposed on not only the wiring channels but also the surface of insulating film. The conductive fine particle layer is planarized so that, referring to FIG. 2(2), horizontally and in planar form, the upper end surface of conductive fine particle layer after polishing planarization is agreement with the upper end surface of insulating film. This planarizing operation is performed by, for example, chemical machine polishing (CMP). The thus removed portion of conductive fine particle layer may be called a sacrificial layer.

After the above formation of integrated circuit, an insulating film (second insulating film) may be provided on the circuit surface. The method of forming the second insulating film is the same as for the above insulating film.

After the formation of the second insulating film, according to necessity, through-holes (connecting channels) for electrical connection with the formed circuit are provided at given positions of the second insulating film. The connecting channels can be formed by, for example, dry etching and generally have a diameter of about 1.5 µm.

A substrate with multilayer integrated circuit can be produced by repeating the above sequence of operations including formation of the insulating film, formation of wiring channels, application of the coating liquid for integrated circuit formation to wiring channels and connecting channels and formation of the second insulating film.

[Substrate with Integrated Circuit]

Figure 3:
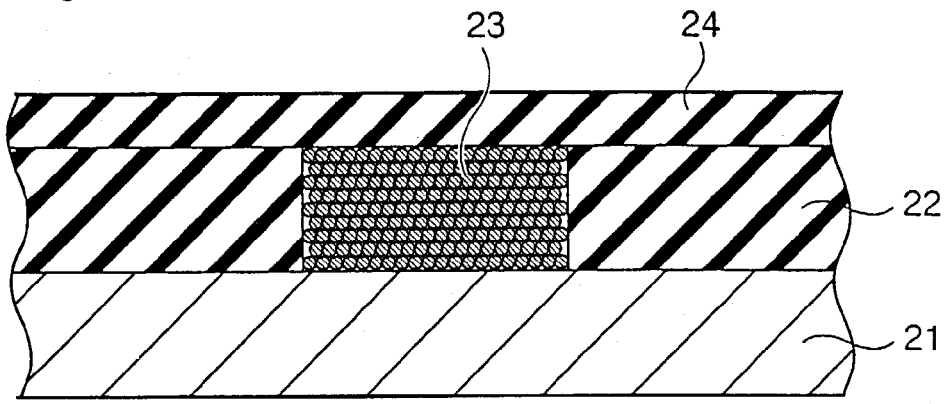
FIG. 3 is a schematic sectional view of one form of substrate with integrated circuit according to the present invention.

With respect to the substrate with integrated circuit obtained by the process for producing an integrated circuit according to the present invention, particular forms thereof will be described below referring to the drawing. FIG. 3 is a schematic sectional view of one form of substrate with integrated circuit according to the present invention. In FIG. 3, numeral 21 denotes a substrate, numeral 22 the first insulating film, numeral 23 a wiring layer, and numeral 24 the second insulating film.

In the substrate with integrated circuit according to the present invention, the substrate 21 is laminated with the first insulating film 22. The wiring layer 23 is provided in the insulating film by the method described above. Further, the second insulating film 24 is superimposed on the insulating film 22 and circuit. (These are referred to as "the first wiring layer").

Moreover, the second wiring layer (not shown) of the same constitution as that of the first wiring layer is formed on the second insulating film 24. The first wiring layer and the second wiring layer are connected to each other by means of through-holes (connecting channels, not shown). Likewise, the third wiring layer, . . . , n-th wiring layer are formed.

In the substrate with multilayer integrated circuit according to the present invention, vertically arranged wiring layers are connected to each other by means of through-holes (connecting channels, not shown).

The connection of wiring layers can be accomplished by providing each insulating film with through-holes (connecting channels) of given diameter (generally about 1.5 μm) by dry etching, for example, RIE (Reactive Ion Etching) and thereafter effecting sputtering. Alternatively, the connection can be accomplished by, at the time of forming an upper-layer circuit, applying the coating liquid for integrated circuit formation under exposure to ultrasonic waves in the same manner as in the above circuit formation so as to densely deposit conductive fine particles in the wiring channels and connecting channels.

Upon the application of the coating liquid for integrated circuit formation while being exposed to ultrasonic waves to the wiring channels according to the present invention, when the coating liquid contains the component for conductive fine particle formation, the exposure to ultrasonic waves leads to formation of conductive fine particles and causes the temperature of coating liquid to rise, thereby evaporating the dispersion medium of coating liquid, so that coating while the coating liquid is being concentrated can be performed. Furthermore, the vibrational energy of ultrasonic waves is transmitted to conductive fine particles, so that the conductive fine particles would collide against the wall of wiring channels, thereby particles would be aligned densely by impact at colliding. Therefore, even when the width of wiring channels is limited, conductive fine particles can be selectively and densely formed into a laminate in the wiring channels.

On the other hand, when the coating liquid contains conductive fine particles, the exposure to ultrasonic waves causes the temperature of coating liquid to rise, thereby evaporating the dispersion medium of coating liquid, so that coating while the coating liquid is being concentrated can be performed. Furthermore, the vibrational energy of ultrasonic waves is transmitted to conductive fine particles, so that the conductive fine particles would collide against the wall of wiring channels to thereby cause impacts, which impacts would realize dense alignment of particles. Therefore, even when the width of wiring channels is limited, conductive fine particles can be selectively and densely formed into a laminate in the wiring channels.

As a result, a circuit of high integration exhibiting excellent adherence to the wiring channels can be obtained by a limited number of coating liquid applications.

The process for producing an integrated circuit according to the present invention enables densely depositing conductive fine particles in wiring channels even when the width of wiring channels is limited. Consequently, a circuit of low resistance value and high density can be formed. Therefore, even when the chip size is large, an increase of propagation delay time of electrical signal can be avoided.

Also, the process of the present invention enables forming a circuit in such a fashion that the upper end surface of wiring channels is substantially in agreement with the upper end surface of conductive fine particle layer. Therefore, the formation of conductive layer high over the upper end surface of wiring channels can be restricted, so that the planarizing operation can be strikingly facilitated and that the end surface after the planarizing operation is excellent in planarity. Accordingly, the process of the present invention ensures an economic advantage in the production of substrate with integrated circuit.

Further, a circuit of high-degree integration in not only the longitudinal direction but also the lateral direction is formed in the obtained substrate with integrated circuit. This leads to a reduction of propagation delay time and to an increase of reliability.

EXAMPLE

The present invention will further be illustrated below with reference to the following Examples which in no way limit the scope of the invention.

Preparation Example

Preparation of Dispersion of Conductive Fine Particles

The compositions of dispersions of metal fine particles and conductive fine particles used in the Examples and Comparative Examples are specified in Table 1.

Dispersions of metal fine particles (Q-1, Q-2 and Q-3) were prepared in the following manner.

First, trisodium citrate was added to 100 g of pure water in an amount corresponding to 0.01 part by weight per part by weight of metal fine particles. Aqueous solutions of silver nitrate, palladium nitrate and copper chloride were added thereto so that the concentration in terms of metal was 10% by weight and so that the metal species had weight ratios specified in Table 1. Further, an aqueous solution of ferrous sulfate was added in a molar amount equal to the total mole of silver nitrate, palladium nitrate and copper chloride and agitated for 1 hr in an atmosphere of nitrogen. Thus, dispersions of metal fine particles were obtained. The resultant dispersions were washed with water by the use of a centrifugal separator to thereby remove impurities and dispersed in water. Thereafter, the dispersions were mixed with solvent (1-ethoxy-2-propanol) and subjected to evaporation by means of a rotary evaporator to thereby remove water and effect condensation. Thus, dispersions of metal fine particles with solid contents specified in Table 1 (S-1, S-2 and S-3) were obtained.

TABLE 1

| | Metal fine particle | | | | |
|---|---|---|---|---|---|
| Dispersion | No. | component | wt. ratio | av. particle diam. | Concn. of metal fine particle |
| S-1 | Q-1 | Ag/Pd | 8/2 | 6 nm | 10 wt % |
| S-2 | Q-2 | Ag/Pd | 6/4 | 10 nm | 10 wt % |
| S-3 | Q-3 | Cu | — | 5 nm | 10 wt % | b) Preparation of Coating Liquid for Integrated Circuit Formation b-1) Preparation of Coating Liquid for Integrated Circuit Formation Containing Metal Fine Particles A solvent of a 3:1 by weight mixture of ethanol and 1-ethoxy-2-propanol was added to each of the above prepared metal fine particle dispersions (S-1, S-2 and S-3) to thereby accomplish dilution. Thus, coating liquids for integrated circuit formation of 0.5% by weight concentration (SC-1, SC-2 and SC-3) were obtained. The coating liquids SC-1, SC-2 and SC-3 correspond to metal fine particle dispersions S-1, S-2 and S-3, respectively.

b-2) Preparation of coating liquid for integrated circuit formation containing component for metal fine particle formation First, trisodium citrate was added to 100 g of pure water in an amount corresponding to 0.01 part by weight per part by weight, in terms of metal, of component for metal fine particle formation. Silver nitrate, palladium nitrate and copper chloride were dissolved therein so that the concentration in terms of metal was 0.5% by weight and so that the metal species had weight ratios specified in Table 2. Further, sodium dodecylsulfate as a surfactant was added to each of the solutions in an amount corresponding to 1 part by weight per part by weight, in terms of metal, of component for metal fine particle formation, and agitated for 30 min in an atmosphere of nitrogen. Thus, coating liquids for integrated circuit formation containing component for metal fine particle formation (SB-1, SB-2 and SB-3) were obtained.

TABLE 2

| Coating liq. | Component | Wt. ratio | Concn. in terms of metal |
|---|---|---|---|
| SB-1 | Ag/Pd | 8/2 | 0.5 |
| SB-2 | Ag/Pd | 6/4 | 0.5 |
| SB-3 | Cu | — | 0.5 | b-3) Preparation of Coating Liquid for Integrated Circuit Formation Containing not only Component for Metal Fine Particle Formation but also Metal Fine Particles Coating liquid for integrated circuit formation containing not only component for metal fine particle formation but also metal fine particles (SD-1) was prepared by mixing the above coating liquid for integrated circuit formation (SB-1) with the above coating liquid for integrated circuit formation (SC-1) at a weight ratio of 1:1.

Example 1

[Formation of Substrate with Integrated Circuit]

A substrate of silicon wafer (8-inch wafer) sequentially overlaid with insulating films, namely, insulating film A of silicon nitride (thickness: 0.2 μm), insulating film B of silica (thickness: 0.4 μm) superimposed on a surface of insulating film A and insulating film C of silicon nitride (thickness: 0.2 μm) superimposed on a surface of insulating film B was coated with a positive photoresist, and subjected to a 0.3 μm line-and-space exposure.

Subsequently, the exposed portions were removed with the use of a developer containing tetramethylammonium hydride (TMAH). Under layer insulating films were patterned with the use of a mixture of $CF_4$ and $CHF_3$ gases. The remaining resist was removed by irradiating the same with $O_2$ plasma. Thus, wiring channels having a width (Wc) of 0.3 μm, a depth (Dc) of 0.6 μm and an aspect ratio (Dc/Wc) of 2 were formed.

Separately, the above prepared dispersion for integrated circuit formation (SC-1) was placed in a container equipped with a nozzle of 5 mm diameter. The substrate provided with wiring channels was coated with the dispersion for integrated circuit formation (SC-1) fed through the nozzle. The dispersion for integrated circuit formation (SC-1) was applied along the above formed wiring channels while exposing the same to ultrasonic waves of 27 kHz and 300 W generated by ultrasonic wave emitter (AUTOCHDER-300, model 5271, manufactured by Kaijo Denki K.K.), thereby depositing metal fine particles (Q-1) in the wiring channels. Thus, a circuit was formed. Thereafter, metal fine particle layers piled slightly high over the upper end surface of wiring channels were subjected to CMP planarizing and cured in a nitrogen atmosphere at 400° C. for 30 min. Further, a 200 nm thick $SiO_2$ film (insulating film) was formed thereon by the CVD technique. Thus, an intended substrate with integrated circuit (A) was obtained.

With respect to the substrate with integrated circuit (A), the amount of deposited conductive fine particles, planarity and relative difficulty of polishing evaluated by comparison of CMP processing speed are listed in Table 2.

Further, with respect to the obtained substrate with integrated circuit (A), the circuit conductivity and denseness of deposited particles were inspected.

The results are listed in Table 3.

The evaluations indicated in Table 3 were performed in the following manner.

(a) Planarity after Coating

Scanning electron micrographs (SEM) of ten circuit sections were observed, and the planarity was evaluated on the following criterion:

planar: ◉ substantially planar: ○ apparently uneven: x.

(b) Relative Difficulty of Polishing

The sacrificial layer (see FIG. 2) on the substrate after coating and drying was polished by means of polishing apparatus (Wafer Polishing System NF-300, manufactured by Nanofactor K.K.) under a load of 200 g/cm$^2$ at a wafer to polishing pad relative speed of 450 cm/min. The relative difficulty of polishing was evaluated on the following criterion based on time required for polishing:

polishing time 1 min or less: ◉ polishing time 2 min or less: ○ polishing time more than 2 min: x.

(c) Conductivity

Figure 4:
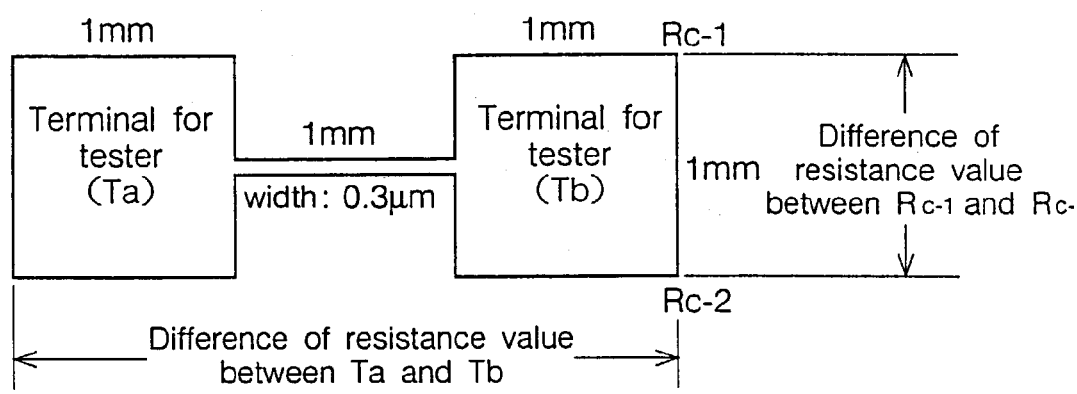
FIG. 4 is a diagram of pattern for evaluating conductivity.
Figure 5:
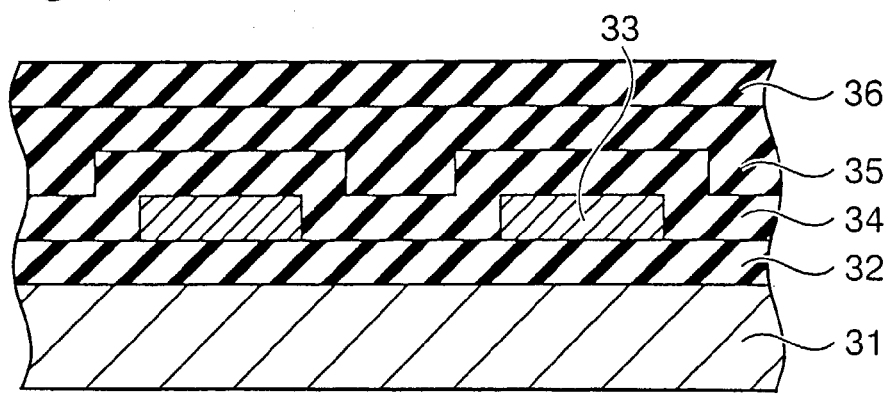
FIG. 5 is a schematic sectional view of a semiconductor integrated circuit according to the prior art.

After the formation of insulating films in the above manner, the silicon wafer substrate was coated with a positive photoresist, and subjected to an exposure of resist portions for one 0.3 μm line and tester terminals (Ta and Tb) as shown in FIG. 4. Subsequently, the exposed portions were removed, and underlayer insulating films were patterned with the use of a mixture of $CF_4$ and $CHF_3$ gases. The remaining resist was removed by irradiating the same with $O_2$ plasma. Thus, wiring channels having a width (Wc) of 0.3 μm, a depth (Dc) of 0.6 μm and an aspect ratio (Dc/Wc) of 2 were formed. A tester was connected to the tester terminals, and the value of resistance (between Ta and Tb) was measured.

Further, referring to FIG. 4, the value of resistance between $R_{c-1}$ and $R_{c-2}$ was measured as a blank for resistance value measurement, and the conductivity was evaluated on the following criterion:

resistance between Ta and Tb=less than 10/1 of resistance between $R_{c-1}$ and $R_{c-2}$: ◉ resistance between Ta and Tb=less than 100/3 of resistance between $R_{c-1}$ and $R_{c-2}$: ○ resistance between Ta and Tb=100/3 or more of resistance between $R_{c-1}$ and $R_{c-2}$: Δ.

(d) Circuit Density

The circuit density was evaluated by observation of SEMs at the time of evaluating the planarity after the coating with the coating liquid for integrated circuit formation:

dense deposition free of holes: ◉ dense deposition although there are some holes: ○
nondense deposition with a small amount of holes: △
voids observed: x.

Example 2

Substrate with integrated circuit (B) was produced in the same manner as in Example 1 except that wiring channels having a width (Wc) of 0.4 μm, a depth (Dc) of 1.6 μm and an aspect ratio (Dc/Wc) of 4 were formed and that the coating liquid for integrated circuit formation (SC-2) was used.

With respect to the obtained substrate with integrated circuit (B), the planarity, relative difficulty of polishing, circuit conductivity and denseness of deposited particles were inspected in the same manner as in Example 1.

The results are listed in Table 3.

Example 3

Substrate with integrated circuit (C) was produced in the same manner as in Example 1 except that the dispersion for integrated circuit formation (SC-3) was used.

With respect to the obtained substrate with integrated circuit (C), the planarity, relative difficulty of polishing, circuit conductivity and denseness of deposited particles were inspected in the same manner as in Example 1.

The results are listed in Table 3.

Comparative Example 1

The same procedure as in Example 1 was repeated except that, without the exposure to ultrasonic waves, the dispersion for integrated circuit formation (SC-1) was applied by the spinner method and dried at 90° C. for 5 min. Substrate with conductor integrated circuit (D) was produced in the same manner as in Example 1 except that the above application and drying was repeated 20 times, thereby depositing metal fine particles (Q-1) in wiring channels so as to form a circuit. After the application was performed 20 times, metal fine particles were so thickly deposited on the insulating film that portions on the insulating film were protrudent while portions on the wiring channels were depressed, thereby forming an uneven surface.

With respect to the obtained substrate with integrated circuit (D), the planarity, relative difficulty of polishing, circuit conductivity and denseness of deposited particles were inspected in the same manner as in Example 1.

The results are listed in Table 3.

Comparative Example 2

Substrate with integrated circuit (E) was produced in the same manner as in Example 1 except that wiring channels having a width (Wc) of 0.2 μm, a depth (Dc) of 0.8 μm and an aspect ratio (Dc/Wc) or 4 were formed, except that, without the exposure to ultrasonic waves, the dispersion for integrated circuit formation (SC-1) was applied by the spinner method and dried at 90° C. for 5 min, and except that the application and drying was repeated 20 times, thereby depositing metal fine particles (Q-1) in the wiring channels so as to form a circuit. After the application was performed 20 times, deposition of conductive fine particles was observed on the insulating film and the wiring channels, which conductive fine particles exhibited the same substantial planarity as in Example 1.

With respect to the obtained substrate with integrated circuit (E), the planarity, relative difficulty of polishing, circuit conductivity and denseness of deposited particles were inspected in the same manner as in Example 1.

The results are listed in Table 3.

Example 4

Substrate with integrated circuit (F) was produced in the same manner as in Example 1 except that the dispersion for integrated circuit formation (SB-1) was used.

With respect to the obtained substrate with integrated circuit (F), the planarity, relative difficulty of polishing, circuit conductivity and denseness of deposited particles were inspected in the same manner as in Example 1.

The results are listed in Table 3.

Example 5

Substrate with integrated circuit (G) was produced in the same manner as in Example 1 except that the dispersion for integrated circuit formation (SB-2) was used.

With respect to the obtained substrate with integrated circuit (G), the planarity, relative difficulty of polishing, circuit conductivity and denseness of deposited particles were inspected in the same manner as in Example 1.

The results are listed in Table 3.

Example 6

Substrate with integrated circuit (H) was produced in the same manner as in Example 1 except that the dispersion for integrated circuit formation (SB-3) was used.

With respect to the obtained substrate with integrated circuit (H), the planarity, relative difficulty of polishing, circuit conductivity and denseness of deposited particles were inspected in the same manner as in Example 1.

The results are listed in Table 3.

Example 7

Substrate with integrated circuit (I) was produced in the same manner as in Example 1 except that the dispersion for integrated circuit formation (SD-1) was used.

With respect to the obtained substrate with integrated circuit (I), the planarity, relative difficulty of polishing, circuit conductivity and denseness of deposited particles were inspected in the same manner as in Example 1.

The results are listed in Table 3.

TABLE 3

|  | Planarity after coating | Relative difficulty of polishing | Conductivity | Circuit density |
|---|---|---|---|---|
| Example 1 | ○ | ◎ | ◎ | ◎ |
| Example 2 | ○ | ◎ | ◎ | ◎ |
| Example 3 | ○ | ○ | ○ | ○ |
| Comp. Ex. 1 | x | x | △ | △ |
| Comp. Ex. 2 | ○ | x | △ | x |
| Example 4 | ○ | ◎ | ◎ | ◎ |
| Example 5 | ○ | ◎ | ◎ | ◎ |
| Example 6 | ○ | ◎ | ◎ | ◎ |
| Example 7 | ○ | ◎ | ◎ | ◎ |

As apparent from Table 3, the integrated circuits formed under exposure to ultrasonic waves (Examples 1 to 7) realize efficient dense deposition of conductive fine particles in minute wiring channels and connecting holes, so that they provide a circuit of high conductivity (low wiring resistance) and high density. Further, therefor, the planarizing can be accomplished easily. By contrast, with respect to the integrated circuits formed by repeated applications according to the spinner method without exposure to ultrasonic waves (Comparative Examples 1 and 2), the polishing for enhanced planarity is difficult, and the circuit conductivity is not satisfactory. Further, these integrated circuits cannot provide a circuit of high density.

The invention claimed is:

1. A process for producing an integrated circuit, comprising coating a substrate provided with wiring channels of given width and given depth with a coating liquid for integrated circuit formation containing 0.05 to 30% by weight of at least one of a component for conductive fine particle formation and conductive fine particles plus a solvent to thereby form an integrated circuit on the substrate, and wherein the conductive fine particles have an average particle diameter which is 70% or less of the width of wiring channels and which is in the range of 1 to 200 nm, and directly exposing the coating liquid for integrated circuit formation to ultrasonic waves as the coating liquid is being applied to the wiring channels, whereby the ultrasonic waves heat the coating liquid to evaporate the solvent, form conductive fine particles, concentrate the coating liquid, dry and densify the conductive particles as they are applied in said wiring channels.

2. The process as claimed in claim 1, which further comprises planarizing a coating surface resulting from the coating with the coating liquid for integrated circuit formation.

3. The process as claimed in claim 1, wherein the conductive fine particles are metal fine particles comprising at least one metal selected from the group consisting of Au, Ag, Pd, Pt, Rh, Ru, Cu, Fe, Ni, Co, Sn, Ti, In, Al, Ta, Sb and W.

4. The process as claimed in claim 1, wherein the depth of wiring channels is in the range of 0.05 to 10 μm, the width of wiring channels is in the range of 0.05 to 100 μm, and the ratio between the depth of wiring channels and the width of wiring channels is in the range of 0.1 to 20.

5. The process for producing an integrated circuit as claimed in claim 1, wherein the coating liquid for integrated circuit formation contains an organic solvent.

6. The process for producing an integrated circuit as claimed in claim 1, wherein the coating liquid for integrated circuit formation contains an organic stabilizer.

7. The process as claimed in claim 2, wherein the conductive fine particles are metal fine particles comprising at least one metal selected from the group consisting of Au, Ag, Pd, Pt, Rh, Ru, Cu, Fe, Ni, Co, Sn, Ti, In, Al, Ta, Sb and W.

8. The process as claimed in claim 2, wherein the depth of wiring channels is in the range of 0.05 to 10 μm, the width of wiring channels is in the range of 0.05 to 100 μm, and the ratio between the depth of wiring channels and the width of wiring channels is in the range of 0.1 to 20.

9. The process as claimed in claim 3, wherein the depth of wiring channels is in the range of 0.05 to 10 μm, the width of wiring channels is in the range of 0.05 to 100 μm, and the ratio between the depth of wiring channels and the width of wiring channels is in the range of 0.1 to 20.

10. The process for producing an integrated circuit as claimed in claim 1, wherein the total ion concentration in the coating liquid is 10 mmol or less per 100 g of solid contents contained in the dispersion.

11. A process for producing an integrated circuit, comprising coating a substrate provided with wiring channels of given width and given depth with a coating liquid for integrated circuit formation containing 0.05 to 30% by weight of at least one of a component for conductive fine particle formation and conductive fine particles to thereby form an integrated circuit on the substrate wherein the depth of wiring channels is in the range of 0.05 to 100 μm, the width of wiring channels is in the range of 0.05 to 100 μm, and the ratio between the depth of wiring channels and the width of wiring channels is in the range of 0.1 to 20, directly exposing the coating liquid for integrated circuit formation to ultrasonic waves as the coating liquid is being applied to the wiring channels, whereby the ultrasonic waves heat the coating liquid to evaporate the solvent, form conductive fine particles, concentrate the coating liquid, dry and densify the conductive particles as they are applied in said wiring channels.

12. A process for producing a substrate with an integrated circuit comprising the steps of:

(a) providing a substrate having wiring channels of a given width and a given depth; and (b) providing an integrated circuit on said substrate by coating the substrate provided with wiring channels of given width and given depth with a coating liquid for integrated circuit formation containing 0.1 to 10% by weight of at least one of a component for conductive fine particle formation and conductive fine particles to thereby form an integrated circuit on the substrate, wherein the coating liquid for integrated circuit formation while being exposed to ultrasonic waves is applied to the wiring channels, and wherein the conductive fine particles have an average particle diameter which is 70% or less of the width of the wiring channels and which is in the range of 1 to 200 nm.

13. A process for producing a substrate with an integrated circuit, comprising the steps of:

(a) providing a substrate having wiring channels of a given width and a given depth;

(b) providing an integrated circuit on said substrate by coating the substrate provided with wiring channels of given width and given depth with a coating liquid for integrated circuit formation containing at least one of a component for conductive fine particle formation and conductive fine particles to thereby form an integrated circuit on the substrate, wherein the coating liquid for integrated circuit formation while being exposed to ultrasonic waves is applied to the wiring channels, and wherein the depth of wiring channels is in the range of 0.05 to 10 μm, the width of wiring channels is in the range of 0.05 to 100 μm, and the ratio between the depth of wiring channels and the width of wiring channels is in the range of 0.1 to 20.

* * * * *

UNITED STATES PATENT AND TRADEMARK OFFICE
CERTIFICATE OF CORRECTION

| | | |
|---|---|---|
| PATENT NO. | : 7,163,892 B2 | Page 1 of 1 |
| APPLICATION NO. | : 10/275087 | |
| DATED | : January 16, 2007 | |
| INVENTOR(S) | : Tonai et al. | |

It is certified that error appears in the above-identified patent and that said Letters Patent is hereby corrected as shown below:

<u>Drawing Sheet 2 of 2</u>, See Fig. 4 "between $R_{c-1}$ and $R_c$."
should read -- between $R_{c-1}$ and $R_{c-2}$ --

<u>On The Title Page</u>,
Insert -- Item (30) Foreign Application Priority Data

May 2, 2000        (JP) ................................2000-133674 --

Signed and Sealed this

Twenty-ninth Day of May, 2007

JON W. DUDAS
*Director of the United States Patent and Trademark Office*